US008125618B2

(12) United States Patent
Lai et al.

(10) Patent No.: US 8,125,618 B2
(45) Date of Patent: *Feb. 28, 2012

(54) REFLECTIVE FILM INTERFACE TO RESTORE TRANSVERSE MAGNETIC WAVE CONTRAST IN LITHOGRAPHIC PROCESSING

(75) Inventors: Kafai Lai, Poughkeepsie, NY (US); Dirk Pfeiffer, Dobbs Ferry, NY (US); Alan E. Rosenbluth, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 738 days.

This patent is subject to a terminal disclaimer.

(21) Appl. No.: 12/208,358

(22) Filed: Sep. 11, 2008

(65) Prior Publication Data

US 2009/0040486 A1   Feb. 12, 2009

Related U.S. Application Data

(62) Division of application No. 11/265,822, filed on Nov. 3, 2005, now Pat. No. 7,470,504.

(51) Int. Cl.
*G03F 7/20* (2006.01)

(52) U.S. Cl. ............................. 355/77; 430/311; 430/395

(58) Field of Classification Search .................... 355/27, 355/53, 67, 71, 77; 430/311, 312, 313, 395
See application file for complete search history.

(56) References Cited

U.S. PATENT DOCUMENTS

| 7,736,841 B2* | 6/2010 | Lai et al. ........................ 430/311 |
| 2004/0227923 A1 | 11/2004 | Flagello et al. |
| 2005/0009163 A1 | 1/2005 | Tong et al. |
| 2005/0091014 A1 | 4/2005 | Gallatin et al. |
| 2005/0091634 A1 | 4/2005 | Gallatin et al. |

FOREIGN PATENT DOCUMENTS

| JP | 05241324 A | 9/1993 |
| JP | 2000323371 A | 11/2000 |

OTHER PUBLICATIONS

Timothy A. Brunner, Nakgueon Seong, William D. Hinsberg, John A. Hoffnagle, Frances A. Houle, Martha I. Sanchez; "High NA Lithographic Imagery at Brewster's Angle"; Proceedings of the SPIE vol. 4691 (2002), pp. 1-10.

Konstantinos Adam, Wilhelm Maurer; "Polarization Effects in Immersion Lithography"; Proceedings of the SPIE vol. 5377 (2004; pp. 329-343.

Information Materials for IdS from JPO Office Action Sep. 6, 2011.

* cited by examiner

*Primary Examiner* — Glen Kao

(74) *Attorney, Agent, or Firm* — DeLio & Peterson, LLC; Kelly M. Nowak; Wenjie Li

(57) ABSTRACT

A system for exposing a resist layer to an image that includes a layer reflective to imaging tool radiation and a resist layer having a region of photosensitivity over the reflective layer. An imaging tool projects radiation containing an aerial image onto the resist layer, with a portion of the radiation containing the aerial image passing through the resist and reflecting back to the resist to form an interference pattern of the projected aerial image through the resist layer thickness. The thickness and location of the resist layer region of photosensitivity are selected to include from within the interference pattern higher contrast portions of the interference pattern in the direction of the resist thickness, and to exclude lower contrast portions of the interference pattern in the resist thickness direction from said resist layer region of photosensitivity, to improve contrast of the aerial image in said resist layer region of photosensitivity.

1 Claim, 5 Drawing Sheets

REFLECTIVE FILM INTERFACE TO RESTORE TRANSVERSE MAGNETIC WAVE CONTRAST IN LITHOGRAPHIC PROCESSING

BACKGROUND OF THE INVENTION

1. Field of the Invention

The present invention is directed to the manufacture of integrated circuits and, in particular, to a method and system for restoring transverse magnetic wave contrast in features made by a lithographic process.

2. Description of Related Art

Manufacturers of microelectronic circuits are continually seeking to produce features having smaller dimensions. The lithographic production of such features typically uses a step-and-scan imaging tool 20, as shown in FIG. 1, to project a pattern onto a photosensitive resist layer on a substrate or wafer. The projection optical system of the imaging tool includes a lamp, laser, or other optical source 22 that projects radiation 24 used to illuminate a photomask or reticle 28 through a condenser lens system 26. The photomask or reticle 28 contains the pattern to be projected and reproduced on the wafer substrate, and is generally oriented substantially perpendicular to an optical axis 24 of the projection optical system. Some of the light radiation 46 that passes through the photomask 28 is collected by the projection optics 34 and the aerial image 36 of the pattern produced by passage of radiation 46 through the mask is directed onto the wafer 42, so as to create the pattern or image 40 on the wafer.

In a step-and-scan system, the photomask 28 and the wafer 42 are mounted on mask stage 33 and substrate stage 38, respectively, that move relative to the fixed optical system. The optical system contains an aperture or slit 32 through which light is allowed to pass to the reticle. The entire mask pattern within the desired transfer region of a reticle is completely exposed by scanning along the one-dimensional scan direction 30 and across the complete one-dimensional width of the transfer region to produce a complete pattern 40 on the wafer resist, for example a complete chip pattern. The scanning process is subsequently repeated to produce the desired number of patterns on the wafer 42.

In order to produce features having smaller dimensions in the manufacture of microelectronic circuits, three factors, a phenomenological process resolution factor (k1), the light wavelength ($\lambda$) and the numerical aperture value (NA) are involved in the lithographic processing that may be used to create the minimum line width ($W_{min}$) according to a standard generalization of Rayleigh's equation:

$$W_{min} = k_1 \lambda / NA$$

Sometimes a slightly different value of k1 is used that relates $\lambda$ and NA to the half-pitch of a periodic system of lines and spaces.

To enable use of finer features in integrated circuits many advances of been made in lithographic technology that allow smaller values of k1. In the early days of integrated circuit manufacture only k1 values above 1 were practical, but now k1 values of 0.4 are being employed, and further reductions are sought. A difficulty here is that image contrast is degraded at such low k1 values, making it difficult to achieve size uniformity in the printed circuit features as distributed over the chip, such size uniformity usually being required for acceptable circuit performance.

Looking at the NA (numerical aperture) factor, recent advances have enabled exposure tool manufacturers to ship tools with NA values in excess of 0.70, 0.80 and higher, and tools with NA values of 0.93 are now available. NA values higher than 1.0 are expected in the future, based on immersion imaging. Because modern exposure tools have such high NA values, images must be formed using waves with high angles of propagation within the resist, i.e., large propagation angles with respect to a direction normal to the surface of the resist layer. Such high angles of propagation may be considered to be those in excess of about 30°, since the orientations of the associated electric field vectors will then show significant variation, in that, for example, the electric field of a ray that has propagated from one side of the lens aperture into the resist can differ in its orientation by as much as 60° from the electric field of a ray that has entered the resist after exiting the opposite side of the lens aperture. It should be noted that resist refractive indices are usually greater than about 1.6, so that a propagation angle of 30° within a resist layer corresponds to an incidence angle for the incoming wave above the resist that is greater than 50° (NA=0.8) if the incident medium is air. Thus, incidence angles greater than about 50° may be considered to be high incidence angles when the incident medium is air, depending on the resist index. However, in an immersion system, where the incident medium might have a refractive index of 1.4, incidence angles greater than about 35° could be considered to be high incidence angles, since they too would produce a propagation angle of 30° or more within a resist layer, depending on the resist index.

At the high numerical apertures that produce such incidence angles, it has been observed that there is a fundamental loss of image contrast for the transverse magnetic (TM) polarization of the light waves. Even if the source radiation can be transverse electric (TE) polarized for the dominant interfering orders, i.e., from a tangentially polarized source, other orders will generally be present that interfere with fields that are partly TM polarized.

In FIG. 2, there is shown the passage of high incident angle light waves through resist layer 50 on either side of a line 47 normal to the surface of the resist layer. As used herein, the term "light" refers to the radiation used in the lithographic imaging system, regardless of wavelength. Incident waves 46a and 46'a enter the resist layer at opposite angles $\theta$, and are refracted as waves 46c, 46'c, respectively. Incident light rays 46a, 46'a carry a high resolution image, and so have a high incidence angle $\theta$ with respect to the direction normal to the surface of resist layer 50 disposed on the wafer. The direction normal to the substrate will be referred to as the z direction. The refractive index of a typical resist layer is generally greater than about 1.6 and often greater than about 1.7, in the range of about 1.6 to 1.8, while the incident medium has a refractive index that is usually 1.0 and in general less than the resist index, so that the angle of the refracted light rays within the resist is generally reduced, i.e., becomes more vertically oriented. The TM polarized electric field vectors from these incident light rays are shown by arrows 46b and 46'b. These electric field vectors are perpendicular to the propagation directions of their respective waves, as required by Maxwell's equations. These interfering electric field vectors are roughly anti-parallel, corresponding to a dark portion of the image.

During half the optical cycle, electric fields 46d and 46'd on the refracted waves are oriented at an angle with a partially downward direction within the resist layer. Because the vectors share a common z component (downward during the part of the optical cycle shown, upward during the other half of the optical cycle, and in general with the same sign), the two vector fields do not completely cancel when superposed, the z components being parallel rather than anti-parallel, and thus the dark portion of the image is not fully dark, and so contrast is reduced, which in turn reduces the controllability of the imaging process, and thus increases the minimum practical k1. The essential problem here is that the lack of complete destructive interference at high NA values results in reduced contrast from the TM polarization component. This is conventionally regarded as a problem that is inherent to high NA imaging, due to the geometry of the propagation angles involved. The associated contrast loss adds to the already significant contrast loss that arises even when the NA value is not large if one forms images at low k1, as is desirable to maximize resolution.

In a similar way, full constructive interference cannot take place in bright regions of a high NA image having nonzero TM component, because the TM polarized electric fields are not fully parallel when propagation angles are steep. This reduces image brightness in TM polarization.

Neither contrast nor brightness is degraded in TE polarization (not shown), in which the electric field is polarized perpendicular to the plane of incidence onto the wafer. However, the printing of circuit patterns generally causes the waves that are incident on almost every small region of the wafer to have planes of incidence that are oriented in many possible azimuths. This is because most circuit patterns are populated fairly densely with fine circuit features in more than one orientation. This makes it impossible to achieve pure TE polarization for all features using a single exposure, and multiple exposures significantly increase cost. Moreover, even if one could theoretically employ waves that contained only a single polarization component, such as TE, the polarization can be distorted in a number of ways, for example by residual birefringence in the mask substrate and lens, diffractive effects in the mask, and thin-film effects in the lens and wafer process films. These polarization distortions can in turn cause variations in the dose that is delivered to different features in the image, since TE and TM peak brightnesses differ. In general, when diverse fine features are present with different orientations, the proportion of TM polarization to TE polarization will vary, and since TE polarization exhibits complete constructive interference, the total delivered dose will vary as the proportion of TM polarization to TE polarization varies. Low k1 imaging is particularly sensitive to dose variations. The sensitivity to polarization distortion is reduced if unpolarized light can be employed, even though unpolarized light can be understood as an incoherent superposition of TM and TE polarized light. However, for successful printing using unpolarized light, it is desirable that both polarizations provide high contrast, and that the resist system not exhibit differential polarization sensitivity that would in effect remove the unpolarized condition.

SUMMARY OF THE INVENTION

Bearing in mind the problems and deficiencies of the prior art, it is therefore an object of the present invention to provide a method and system for improving contrast of the image of a feature projected onto the resist layer in a lithographic process when using a high numerical aperture imaging tool.

It is another object of the present invention to provide a method and system for restoring transverse magnetic wave contrast in lithographic processing.

A further object of the invention is to provide a method for carrying out high numerical aperture lithographic processing using light that is substantially unpolarized.

Yet another object of the invention is to provide a method for carrying out high numerical aperture lithography that is insensitive to changes of polarization induced by the mask, imaging optics, or wafer process films.

Still other objects and advantages of the invention will in part be obvious and will in part be apparent from the specification.

The above and other objects, which will be apparent to those skilled in the art, are achieved in the present invention which is directed to a method of exposing a resist layer with regions of photosensitivity to an image in a lithographic process using a high numerical aperture imaging tool comprising providing an imaging tool having a high numerical aperture for projecting radiation forming an aerial image, and providing a substrate having a layer reflective to the imaging tool radiation and a resist layer with a region of photosensitivity over the reflective layer, the resist layer having a thickness. The method then includes projecting radiation containing an aerial image from the imaging tool onto the resist layer, a portion of the radiation containing the aerial image passing through the resist layer, and reflecting a portion of the radiation containing the aerial image that passes through the resist layer off the reflective layer back to the resist layer. The reflected radiation forms an interference pattern in the resist layer of the projected aerial image through the resist layer thickness. The location of the resist layer region of photosensitivity with respect to the reflective layer is selected to include from within the interference pattern higher contrast portions of the interference pattern in the direction of the resist thickness, and to exclude lower contrast portions of the interference pattern in the resist thickness direction from said resist layer region of photosensitivity, to improve contrast of the aerial image in said resist layer region of photosensitivity.

The radiation includes transverse magnetic waves and the reflective layer is reflective to the transverse magnetic waves, and the interference pattern in the resist layer region of photosensitivity includes higher contrast portions of the interference pattern created by the transverse magnetic waves.

In another aspect, the present invention is directed to a system for exposing a resist layer with regions of photosensitivity to an image in a lithographic process using a high numerical aperture imaging tool comprising a substrate having thereover a layer reflective to the imaging tool radiation and a resist layer having a region of photosensitivity over the reflective layer, with the resist layer having a thickness. The imaging tool is adapted to project radiation containing an aerial image onto the resist layer, with a portion of the radiation containing the aerial image passing through the resist layer and reflecting back to the resist layer. The reflected radiation forms an interference pattern in the resist layer of the projected aerial image through the resist layer thickness. The thickness and location of the resist layer region of photosensitivity with respect to the reflective layer are selected to include from within the interference pattern higher contrast portions of the interference pattern in the direction of the resist thickness, and to exclude lower contrast portions of the interference pattern in the resist thickness direction from said resist layer region of photosensitivity, to improve contrast of the aerial image in said resist layer region of photosensitivity.

The resist layer thickness with respect to the reflective layer is preferably selected to include in the interference pattern a single higher contrast region of a transverse magnetic wave interference pattern in the resist thickness direction, and to exclude lower contrast regions of the transverse magnetic wave interference pattern from the resist layer in the resist thickness direction, to improve contrast of the aerial image in the resist layer. The resist layer preferably includes an inorganic moiety selected from the group consisting of silicon, iron, hafnium and titanium, and combinations thereof.

A spacer layer is preferably included between the reflective layer and the resist layer. The spacer layer preferably comprises an organic copolymer and has a refractive index of about 1.7.

The resist layer preferably has a thickness less than about:

$$(2*k1*\lambda/NA)/\mathrm{Sqrt}[(4*k1*n/NA)^2-1],$$

where k1 is the half-pitch k1-factor of the process, and n is the refractive index of the resist.

More preferably, the resist layer has a thickness of less than 30 nm, for example about 15 to 30 nm, and is spaced from the reflective layer by a spacer layer having a thickness of at least 60 nm.

The method is particularly useful where the imaging tool has a numerical aperture value of at least 0.95.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 3-8 of the drawings in which like numerals refer to like features of the invention.

To improve contrast in an image during exposure of the resist layer in a lithographic process when using a high numerical aperture imaging tool, the present invention employs reflective interference of transverse magnetic (TM) waves that have z components which are oppositely oriented to those of the incoming image waves, and selection of a resist layer thickness and photosensitivity location that are appropriately matched to the z interference pattern, above a layer reflective to the radiation employed in the imaging tool.

Figure 1:
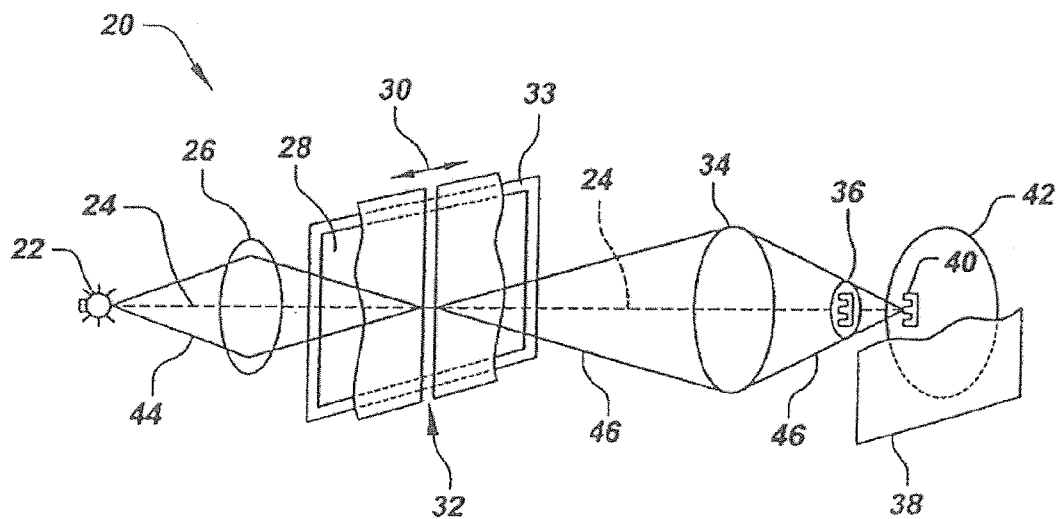
FIG. 1 is a perspective view of a step and scan exposure system for projecting a masked image onto a wafer.
Figure 2:
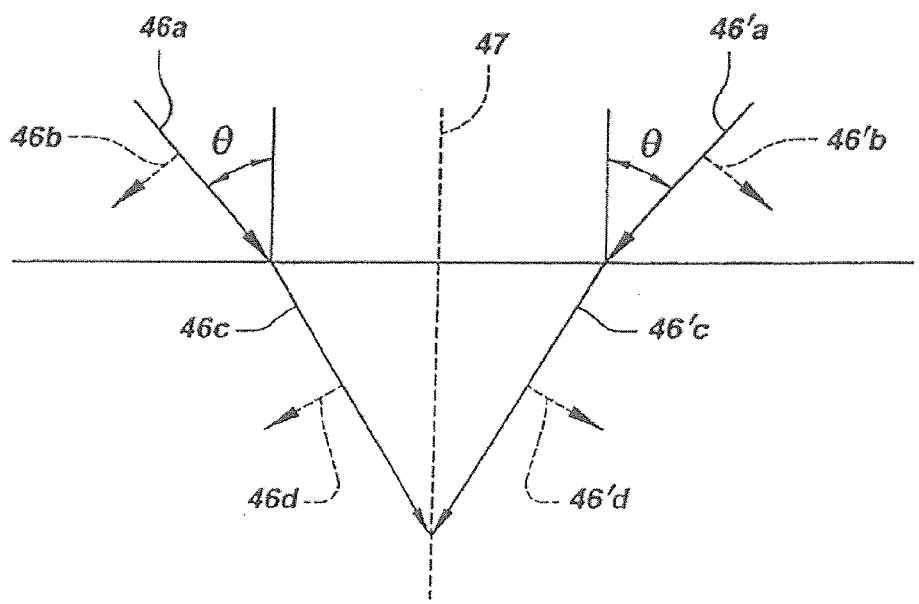
FIG. 2 is a cross sectional elevational view of the refraction of high incident angle TM polarized light rays into the resist layer of a wafer.
Figure 3:
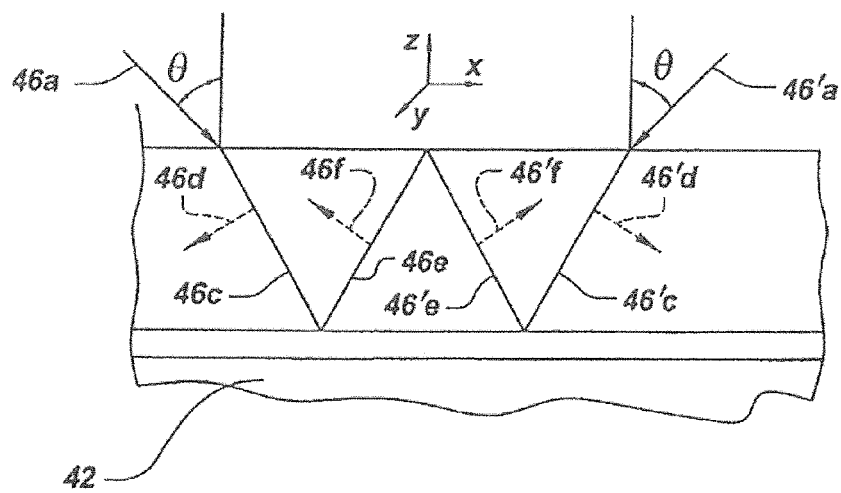
FIG. 3 is a cross sectional elevational view of the passage of high incident angle light rays through a wafer resist layer and reflected from a reflective layer on the wafer substrate.

In FIG. 3, there is shown the passage of high incident angle light waves through resist layer 50. Incident waves 46a and 46'a enter the resist layer at opposite angles θ, and are refracted as waves 46c, 46'c, respectively. The TM polarized electric field vectors from these incident light rays are shown by arrows 46b and 46'b. During half the optical cycle, electric fields 46d and 46'd on the refracted waves are oriented at an angle with a partially downward direction within the resist layer, i.e. a downward pointing component along the z axis.

In accordance with the present invention, FIG. 3 shows a configuration that provides between resist layer 50 and wafer substrate 42 a layer 60 which is reflective to the light utilized in the imaging system. It should be noted that FIG. 3 does not show a preferred rendering of the preferred embodiment of the invention even though it includes reflective layer 60, since resist layer 50 is of conventional form. Typically, for radiation of wavelength of about 157 nm to 365 nm, the invention employs a reflective system of layers that may comprise an aluminum film of about 100 nm thickness. Each light ray 46c, 46'c is reflected off of reflective film 60, producing reflected waves 46e and 46'e, respectively. These reflected rays have TM vectors 46f and 46'f, respectively, which are oriented at an angle in a generally upward direction during the half of the optical cycle in which fields 46d and 46'd are oriented generally downward. At the z position shown, the vector sum of the 4 vectors 46d, 46'd, 46f, and 46'f is almost zero, because of the geometrical orientation of these fields and the high reflectivity of the reflective layer. In other words, destructive interference is almost complete at the z position shown, because the z components of the reflected waves 46e and 46'e that have been produced by the reflective layer are oppositely oriented to the z components of the incident image waves 46c and 46'c, and have almost equal magnitude. More generally, as a result of the interference of TM rays 46d, 46'd with 46f, 46'f, an interference pattern is formed in the z-direction, i.e., through the thickness of resist layer 50. While a nearly complete destructive interference can in principle be achieved, perfect constructive interference is not achieved in all four TM waves shown. In this configuration, vector interference reduces peak dose in TM polarization compared to TE polarization, but within certain planes does not reduce TM contrast. However, even though, as in the prior art, constructive interference is incomplete, the new configuration usually causes overall TM dose to increase within the planes of high TM contrast, since the resist is now exposed by both incident and reflected waves. A dose variation in the z-direction occurs in both TE and TM polarizations. Planes of maximum TM dose are also planes of maximum TM contrast.

Figure 4:
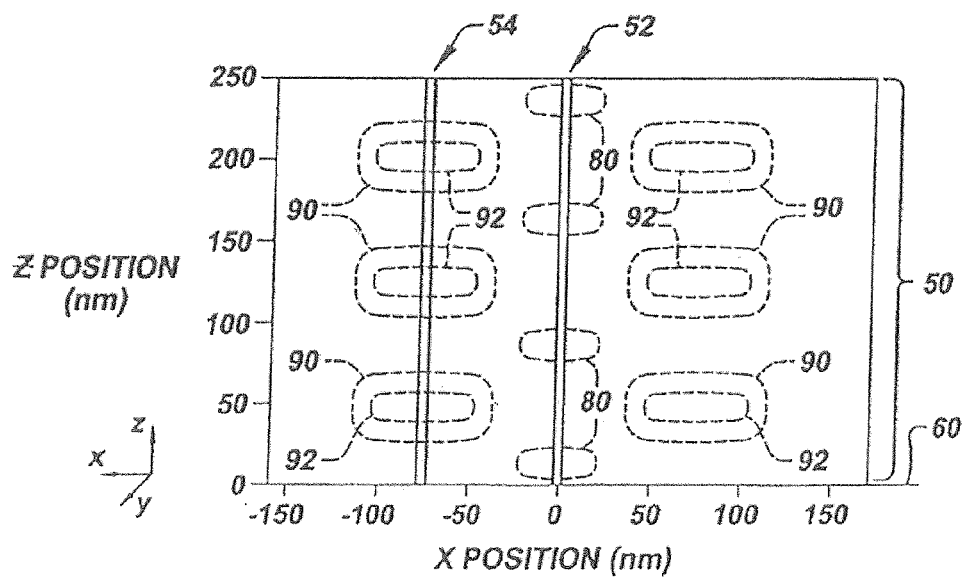
FIG. 4 is a cross sectional elevational view showing the changes in contrast in the x- and z-directions produced in a resist layer in TM polarization as a result of a reflective layer on the wafer substrate.

FIG. 4 shows the interference pattern created by such high incident angle TM waves through the thickness of resist layer 50, as a result of reflection from reflective film 60. The z-direction is through the thickness of the resist layer (shown having a thickness of 250 nm) and the x- and y-direction is in the plane of the resist layer. In this figure, nominally dark line 52 is formed at x-position of approximately 0, and bright space 54 is formed at x-position of approximately −80 nm. The interference patterns are also shown for additional dark lines (not identified) at x-positions of approximately +160 nm and −160 nm, and for a bright space (not identified) at x-position of approximately +80nm. The dark lines and bright spaces continue to repeat outside the boundaries of the figure. Along dark line 52, the lighter regions 80 that are spaced apart in the z-direction are regions of less contrast (where the line would be seen to be less dark), separated by spaced-apart regions where the contrast is at a maximum (where the line would be seen to be darker). For example dark line 52 has less contrast regions 80 at z-positions of approximately 13 nm, 88 nm, 163 nm and 238 nm, and has regions of maximum contrast at heights of approximately 50 nm, 125 nm, and 200 nm. For bright line 54, the high intensity regions 90 with higher intensity centers 92, spaced apart in the z-direction, are seen as corresponding to the high contrast regions of dark line 52.

Figure 5:
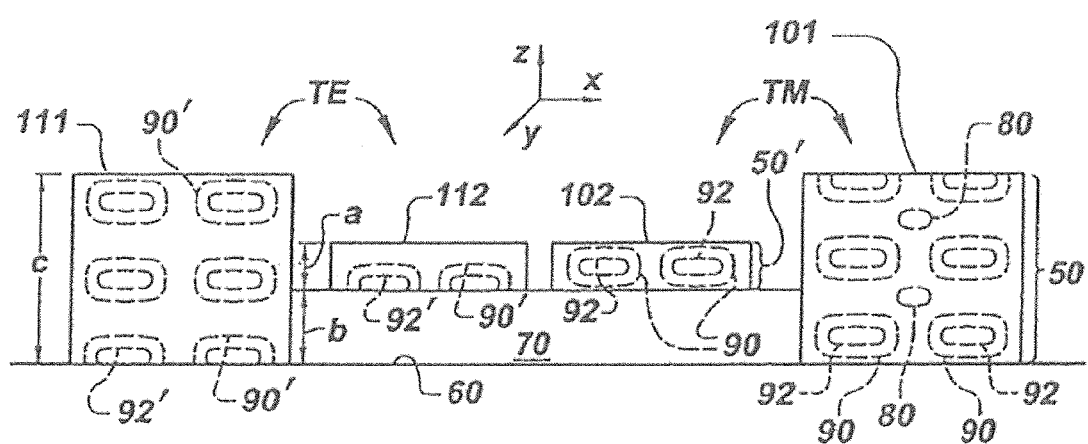
FIG. 5 is a cross sectional elevational view showing the selection to maximize TM contrast of resist photosensitivity location with respect to a reflective layer, and selection of resist thickness, in accordance with the present invention.

FIG. 5 shows the interference patterns for both TM and TE polarized waves produced in a resist layer 50 of conventional thickness c by a reflective layer. As will now be explained, FIG. 5 can also be understood as including a rendition of the invention that has been annotated with other features to help explain the functioning of the invention. The resist layer of conventional thickness 50 has TM interference pattern 101 with low contrast region 80 along with high intensity region 90 and region 92 of even higher intensity, and TE interference pattern 111 with comparable high intensity regions 90' and 92', but with uniformly high contrast. To exploit the complete destructive interference obtained with underlying reflective layer 60, in accordance with the present invention the portion of the resist that would have the highest TM contrast in the z-direction thickness is utilized for the resist layer to be employed on the wafer. In other words, a resist layer of less than conventional thickness is positioned at a desired location above reflective layer 60, and with a suitable thickness, so that it includes the interference pattern portions having higher contrast, and excludes at least some, preferably most, of those interference pattern portions that would have a lower contrast. In general, one matches the location and thickness of the resist photosensitivity region or regions with the high contrast regions of the interference pattern along z.

A preferred resist layer selection is shown in FIG. 5, in which a thin imaging layer photosensitive portion 50' having thickness a at a distance b above reflective layer 60 is selected as the resist layer thickness and location to be utilized. Photosensitive resist layer 50' is seen as including the TM interference portion 102 having the highest contrast from TM interference pattern 101, and excludes those portions of the interference pattern that have lesser TM contrast. While the thickness a of photosensitive resist layer 50' is shown encompassing only a single region of high TM contrast in the z-direction, multiple regions of high TM contrast in the z-direction may be used if the upper and lower adjacent regions of lesser contrast are excluded. To ensure the proper location of the photosensitive resist layer 50' with respect to reflective layer 60, a spacer layer 70 of thickness b may be employed. The z-direction thickness of photosensitive resist layer 50' is typically thinner than normally used, to confine the resist exposure to only a single region of unreversed TM contrast within what would normally be the full interference pattern in a thicker resist layer 50.

The selected TM interference pattern 102 is shifted vertically relative to the TE interference pattern portion 112 in photosensitive resist layer 50', due to differential TE/TM phase shift from the reflective layer on the substrate in the presence of the spacer medium 70. The photosensitive resist layer 50' may also be selected by its location to exclude part of the TE bright fringe (which is actually brighter than the TM intensity, but plotted here with an independent brightness scale), in order to approximately match the collected TE dose with the TM dose. Since the system then provides substantially equal doses in TE and TM polarization as well as substantially equal contrasts, it may be used with unpolarized light, and is not vulnerable to the polarization sensitivities described above. Together, the spacer layer and reflective film comprise a reflective layer system. Other highly reflective layer combinations can be used, so long as the reflective layer system is thin enough to remain substantially within the folded depth of focus of the imaging system, where the TM phase shift positions the photosensitive resist portion near a plane of high TM contrast, and where preferably the TE/TM differential phase shift approximately balances the TE and TM doses within the photosensitive region. Usually the last of these design objectives is less important than the other two. The TE and TM interference patterns of FIG. 5 are only schematic in such embodiments, but a qualitatively very similar analysis applies in general as far as the interfering waves within the photosensitive regions are concerned.

A quantitative analysis can be carried out using the equations provided by Rosenbluth et al. in "Fast calculation of images for high numerical aperture lithography," SPIE v.5377-Optical Microlithography XVII, (2004): p. 615. Using eq. 11 or eq. 19 of that reference, one can show that with the proper spacer thickness the TM contrast ratio (CR) is given by $$CR = \frac{1 - 2\sin^2\theta'' \frac{1+|r|^2}{(1+|r|)^2}}{1 - 4\sin^2\theta'' \frac{|r|}{(1+|r|)^2}}$$

Here $\theta''$ is the angle of propagation inside the resist film, and r is defined as $$r \equiv v_p/u_p$$

r is essentially the reflectivity of the reflective film stack when placed within the wafer film stack. $v_p$ and $u_p$ are the amplitudes of the up-traveling and down-traveling TM waves, respectively, per unit incident wave amplitude. $v_p$ and $u_p$ may be calculated using standard thin film methods, as explained in Rosenbluth et al. The value r is particularly easy to calculate when the resist layer can be approximated as a dielectric; in that case one can simply ignore all films above the resist layer, and treat the incident medium as a semi-infinite film of index equal to the resist index. CR in these equations is defined as:

$$(I_{max}-I_{min})/(I_{max}+I_{min}),$$

where $I_{max}$ is the intensity of a bright space, and $I_{min}$ the intensity of a dark line, under standard lithographic conditions for producing two-beam line/space images. When the spacer thickness is not optimal the phase of r changes, and CR may be calculated from:

$$\frac{I_{min}}{I_{max}} = \frac{1-CR}{1+CR} = \tan^2\theta'' \frac{1 - 2\frac{|r|}{1+|r|^2}\cos\phi}{1 + 2\frac{|r|}{1+|r|^2}\cos\phi}$$

where $\phi$ is the change in phase of r.

In conventional resist systems r is fairly small, and thus $CR \approx 1-2*\sin^2\theta''$ conventionally; clearly CR can be degraded quite substantially when the propagation angle inside the resist is large. On the other hand, if $|r| \approx 1$, $Cr \approx 1$ when $\phi=0$. Moreover, the difference between the $2|r|$ factor appearing in the denominator of the above CR equation and the $1+|r|^2$ expression in the numerator will decrease quadratically as $|r|$ approaches 1, which means that very substantial contrast improvement is possible even when $|r|$ is only moderately large.

The photosensitive resist layer used in accordance with the present invention preferably has a thickness less than about $$(2*k1*\lambda/NA)/\text{Sqrt}[(4*k1*n/NA)^2-1],$$

where k1 is the half-pitch k1-factor of the process, and n is the refractive index of the resist. More preferably, the photosensitive resist layer thickness is less than about half this amount, in the range of about 15 to 30 nm.

Figure 6:
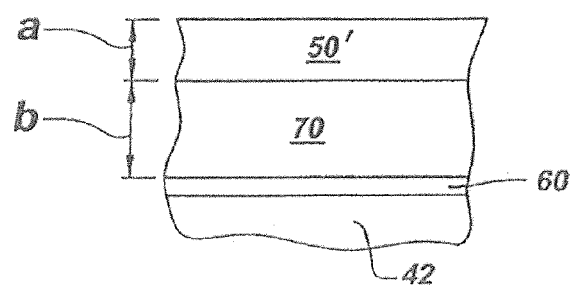
FIG. 6 shows the selected resist photosensitivity location and thickness, in accordance with the present invention.

For clarity the components of the invention in the FIG. 5 embodiment are shown in isolation in FIG. 6, with the TE and TM interference patterns removed.

In a preferred embodiment, the photosensitive resist layer has as high an index of refraction as possible, where n is preferably greater than 1.85, and has hardmask properties for etch resistance when used in a thin layer in accordance with the present invention. Suitable materials showing sufficient etch resistance may be chosen from photoresist systems containing inorganic moieties. Typical examples of resist systems suitable for 193 nm lithography where the inorganic moiety is silicon are described in U.S. Pat. Nos. 6,770,419, 6,653,048 and 6,444,408. Additional examples of resist systems where the inorganic moiety is ferrocene (iron), hafnium based, or titanium based, are described in U.S. Pat. No. 6,171,757. The disclosures of these patents are hereby incorporated by reference. Although the inorganic moieties used in this invention may exhibit high absorbance at 193 nm lithography a combination between silicon and inorganic moieties such as titanium, hafnium or ferrocene maybe used to achieve the appropriate index as well as transparency suitable for the thin photosensitive layers employed in this invention.

The preferred spacer used in the present invention is an organic copolymer, such as an acrylate or polystyrene, with a refractive index of about 1.7 when the resist film has a high index, such as above 1.85. For very high index resist, and spacer indices of about 1.7, the optimum thickness of the spacer can be about 64 nm, and can preferably be chosen in the range of about 64±5 nm.

In general, the appropriate spacer thickness for a given set of film indices can be determined either by simulation, using for example one of the commercially available lithography simulation programs, or experimentally, by spinning a spacer with a graded thickness onto a test wafer, and then determining the optimal thickness by comparing the performance in different regions of the test wafer, in particular by finding the region and associated spacer thickness that minimizes the difference between TE and TM doses.

A resist layer may be photosensitive in its top portion, and it may be formed or treated in such a way that its remaining portion can be etched through after the exposed areas in the photosensitive portion have been developed away, supposing first that the resist is a positive-tone resist. This is also possible for negative-tone resists, except that with negative-tone resists it is the unexposed portions of the photosensitive portion that are developed away. Alternatively, a different underlayer film may be etched through after developing an image in an upper photosensitive resist layer. The developed region and the etched region can then serve as a stencil to transfer the pattern into a constituent film of the integrated circuit that is undergoing fabrication. In this context, the photosensitive region includes only those portions of the resist that both respond to the exposing image, and that respond to the post-exposure developer, since it is only the developed regions whose pattern is transferred into the integrated circuit. In many cases the resist layer is heated after being exposed but before being developed. When the thickness of the photosensitive region is in the range of 15 nm to 30 nm, this heating step smoothes the exposing profile across this thickness, rendering it reasonably uniform over the z range.

Figure 7:
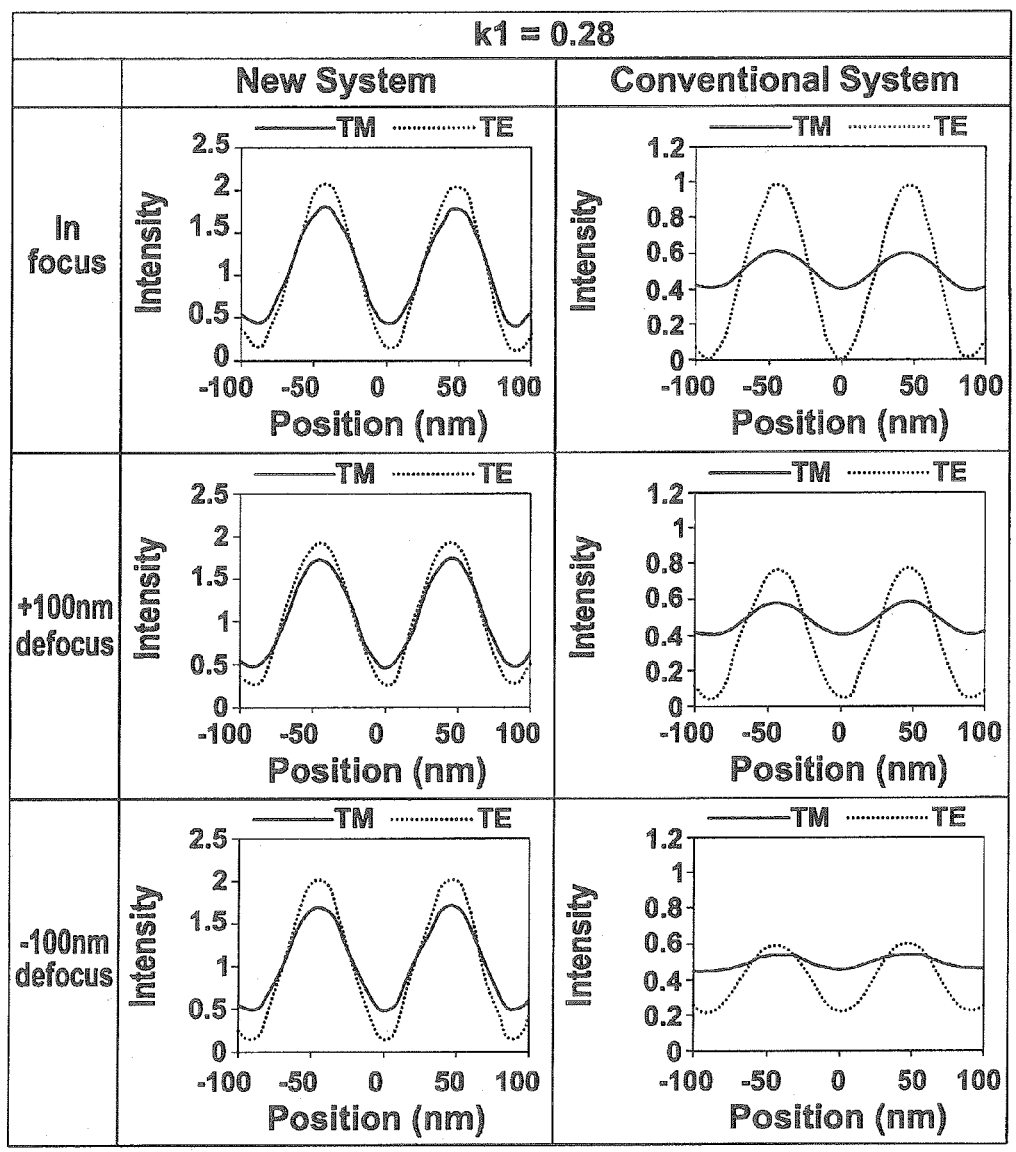
FIG. 7 shows graphical representations of the performance of the invention in substantially restoring TM contrast when printing low-k1 lines and spaces.

Resist refractive indices of about 1.7 can be achieved when the inorganic moiety is silicon, and this chemistry is very well developed. A suitable spacer index for such a resist is n=1.6, and the thickness of the spacer can be about 77±5 nm. FIG. 7 shows graphical representations of a test of this configuration of the invention made by simulating the exposure of a wafer to a line/space pattern of 90 nm pitch produced by an alternating phase shifting mask using a conventional light source with poles of radius 0.1 positioned such that the +/−$1^{st}$ orders are centered at a pupil coordinate of 0.89 (expressed as a fraction of the pupil radius), a wavelength of 193 nm, an NA of 1.2, and a coupling index of refraction of 1.43. This corresponds to a k1 factor of 0.28 for the half-pitch. The wafer substrate has a reflective layer of aluminum of 100 nm thickness, a spacer layer of 77 nm thickness and refractive index of 1.6, and a resist layer of 20 nm thickness and refractive index of 1.7. The plotted exposure profile is the average over the 20 nm z range. When compared to a conventional resist layer of 160 nm thickness and refractive index of 1.7, without the reflective layer and spacer, the present invention is seen to produce much higher TM contrast than the conventional resist and wafer combination, and to substantially match TE and TM doses. Focus for the conventional system has been set according to a criterion of maximizing TM contrast, but nonetheless the TM contrast achieved by the conventional system is very poor. The conventional system could instead be adjusted for a better TE depth of focus, but in that case the TM contrast would be even worse.

At the relatively steep propagation angles entailed by k1=0.28 imaging, the invention achieves a TM phase shift from the reflective layer system that provides high TM contrast in the resist layer, and a differential TE/TM phase shift that substantially balances the TE and TM doses. As is standard practice in the lithography art, the source parameters are optimized around the most aggressive k1 features present, in this case the k1=0.28 features. This optimization improves depth of focus, a requirement that the invention eases in one respect, due to the thin resist layer used, but makes more stringent in another respect, since the reflected waves must remain reasonably well focused. FIG. 7 shows that, overall, the invention provides a depth of focus that is acceptable for such an aggressive k1 factor, and in particular a better depth of focus than the conventional system under conditions where non-negligible TM contrast is required.

Figure 8:
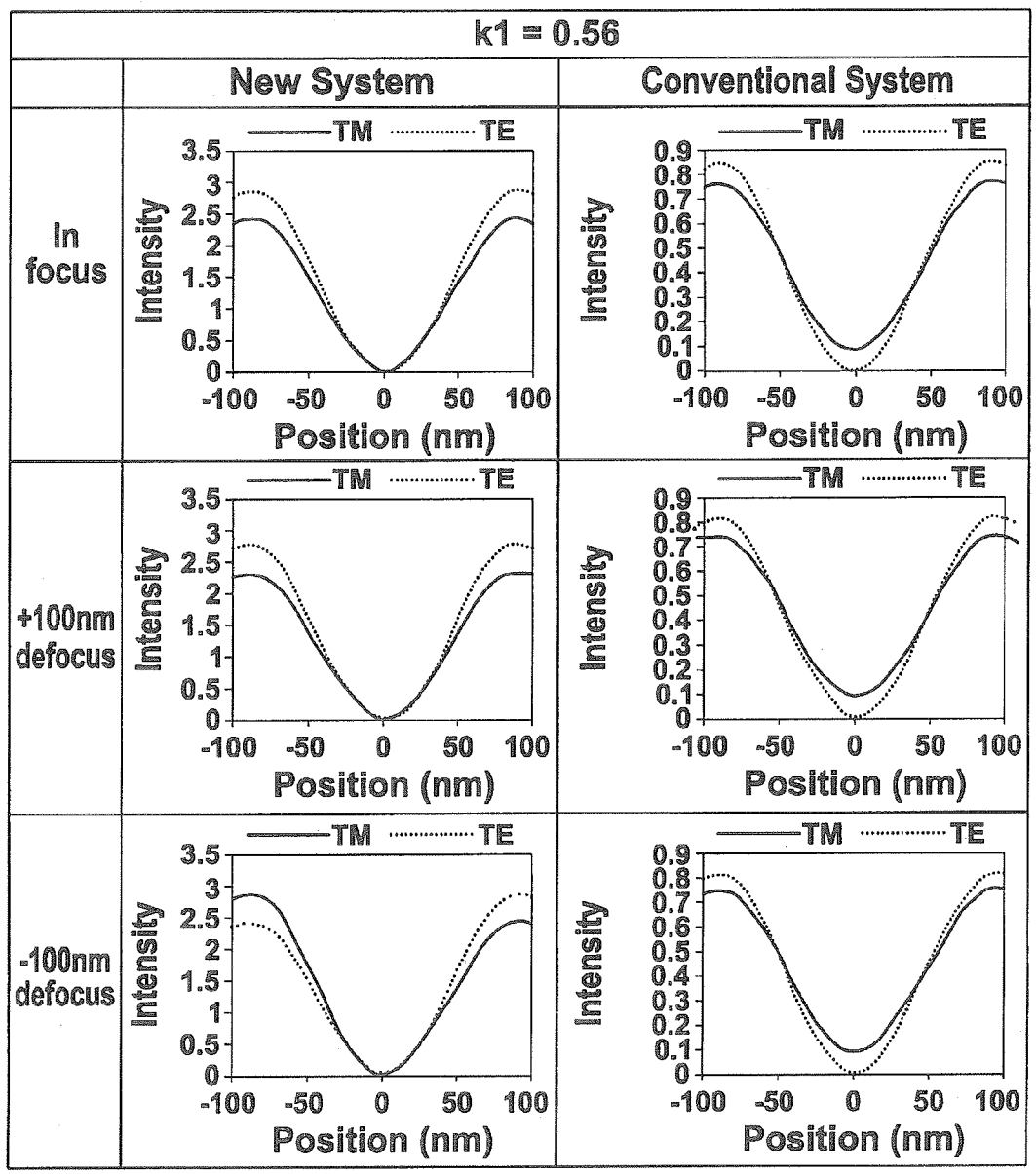
FIG. 8 shows graphical representations of the performance of the invention in maintaining TM contrast when printing moderate-k1 lines and spaces.

All of these imaging requirements tend to be more easily achieved at the smaller propagation angles that are associated with larger k1 factors. However, one must also verify that process parameters optimized for the most aggressive k1 features will perform adequately for any features with larger k1 factor that may be present, even though these parameters are not optimized for the larger k1 features. FIG. 8 illustrates that the invention achieves this, using an example where the invention is applied to a so-called "DFM design", in which moderate-pitch features are present at twice the pitch of the most aggressive k1 features.

Thus, the present invention provides improved contrast of the image of a feature projected onto the resist layer in a lithographic process when using a high numerical aperture imaging tool. The present invention restores transverse magnetic wave contrast in lithographic processing by providing a film stack that reflects additional interfering waves into the image in order to enable full destructive interference, and that achieves better uniformity with respect to other polarization dependencies such as TE versus TM dose, and permits the use of unpolarized light.

If stray light increases from the reflective layer system, the effect may be ameliorated by adding an absorbing topcoat, because the image will only be attenuated by the transmission of this topcoat, while reflected stray light will be reduced by the square of the topcoat transmission. Alternatively, the effect of stray light may be corrected using other known flare correction methods that have recently been developed, for example those described in US20050091634A1, US20050091631A1, and US20050091014A1.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

Thus, having described the invention, what is claimed is:

1. A system for exposing a resist layer with regions of photosensitivity to an image in a lithographic process using a high numerical aperture imaging tool comprising:
    a substrate having thereover a layer reflective to the imaging tool radiation;
    a spacer layer comprising an organic copolymer over the reflective layer, the spacer layer having a thickness of at least 60 nm and a refractive index of about 1.7; and
    a resist layer having a region of photosensitivity over the spacer layer, the resist layer having a thickness of about 15 to 30 nm and including an inorganic moiety selected from the group consisting of silicon, iron, hafnium and titanium, and combinations thereof;
    wherein the imaging tool has a numerical aperture value of at least 0.95 and is adapted to project radiation containing an aerial image onto the resist layer, the radiation including transverse magnetic waves, with a portion of the radiation containing the aerial image passing through the resist layer and reflecting back to the resist layer, the reflective layer being reflective to the transverse magnetic waves, the reflected radiation forming an interference pattern in the resist layer of the projected aerial image through the resist layer thickness, and
    wherein the thickness and location of the resist layer region of photosensitivity with respect to the reflective layer are selected to include from within the interference pattern a single higher contrast region of the interference pattern created by the transverse magnetic waves in the direction of the resist thickness, and to exclude lower contrast portions of the transverse magnetic wave interference pattern in the resist thickness direction from said resist layer region of photosensitivity, to improve contrast of the aerial image in said resist layer region of photosensitivity.

* * * * *